US012660629B2

(12) United States Patent
Lin et al.

(10) Patent No.: US 12,660,629 B2
(45) Date of Patent: Jun. 16, 2026

(54) METHOD FOR FABRICATING PHYSICALLY UNCLONABLE FUNCTION DEVICE

(71) Applicant: UNITED MICROELECTRONICS CORP., Hsin-Chu City (TW)

(72) Inventors: Hung-Chan Lin, Tainan City (TW); Chang-Yih Chen, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 361 days.

(21) Appl. No.: 18/369,207

(22) Filed: Sep. 18, 2023

(65) Prior Publication Data

US 2025/0054880 A1    Feb. 13, 2025

(30) Foreign Application Priority Data

Aug. 7, 2023    (TW) ................................ 112129485

(51) Int. Cl.
| | |
|---|---|
| *H10W 42/40* | (2026.01) |
| *H10B 61/00* | (2023.01) |
| *H10W 20/00* | (2026.01) |

(52) U.S. Cl.
CPC ............ *H10W 42/40* (2026.01); *H10B 61/00* (2023.02); *H10W 20/01* (2026.01)

(58) Field of Classification Search
CPC ..... H01L 23/573; H01L 21/768; H10B 61/00; H10N 50/01; H10N 50/10
See application file for complete search history.

(56) References Cited

U.S. PATENT DOCUMENTS

| | | | |
|---|---|---|---|
| 2014/0042628 A1* | 2/2014 | Edelstein | ............ H01L 23/5228 |
| | | | 438/618 |
| 2016/0170856 A1 | 6/2016 | Kim et al. | |
| 2021/0305499 A1* | 9/2021 | Xie | ........................ H10N 50/10 |

* cited by examiner

*Primary Examiner* — Alexander G Ghyka
(74) *Attorney, Agent, or Firm* — Winston Hsu

(57)    ABSTRACT

A method for fabricating a physically unclonable function (PUF) device includes the steps of first providing a substrate comprising a magnetoresistive random access memory (MRAM) region, a PUF cell region, and a non-PUF cell region, forming a first metal interconnection on the MRAM region, forming a second metal interconnection on the PUF cell region, and forming a third metal interconnection on the non-PUF cell region. Preferably, the first metal interconnection and the second metal interconnection include patterns of different shapes and the first metal interconnection and the third metal interconnection include patterns of same shape.

7 Claims, 2 Drawing Sheets

METHOD FOR FABRICATING PHYSICALLY UNCLONABLE FUNCTION DEVICE

BACKGROUND OF THE INVENTION

1. Field of the Invention

The invention relates to a method for fabricating a physical unclonable function (PUF) device.

2. Description of the Prior Art

Even though integrated circuits are usually fabricated by similar processes with same materials, each of the integrated circuits could still have a unique feature or variation specific to itself. In recent years, researchers have come up with physical unclonable function (PUF) devices that utilize specific variations in integrated circuits as a unique feature similar to human DNA. Due to its nature of randomness, the output of PUF devices are very difficult to predict thereby increasing its level of security.

SUMMARY OF THE INVENTION

According to an embodiment of the present invention, a method for fabricating a physically unclonable function (PUF) device includes the steps of first providing a substrate comprising a magnetoresistive random access memory (MRAM) region, a PUF cell region, and a non-PUF cell region, forming a first metal interconnection on the MRAM region, forming a second metal interconnection on the PUF cell region, and forming a third metal interconnection on the non-PUF cell region. Preferably, the first metal interconnection and the second metal interconnection include patterns of different shapes and the first metal interconnection and the third metal interconnection include patterns of same shape.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
FIG. 1 illustrates a method for integrating a MRAM device and a PUF device according to an embodiment of the present invention.
Figure 2:
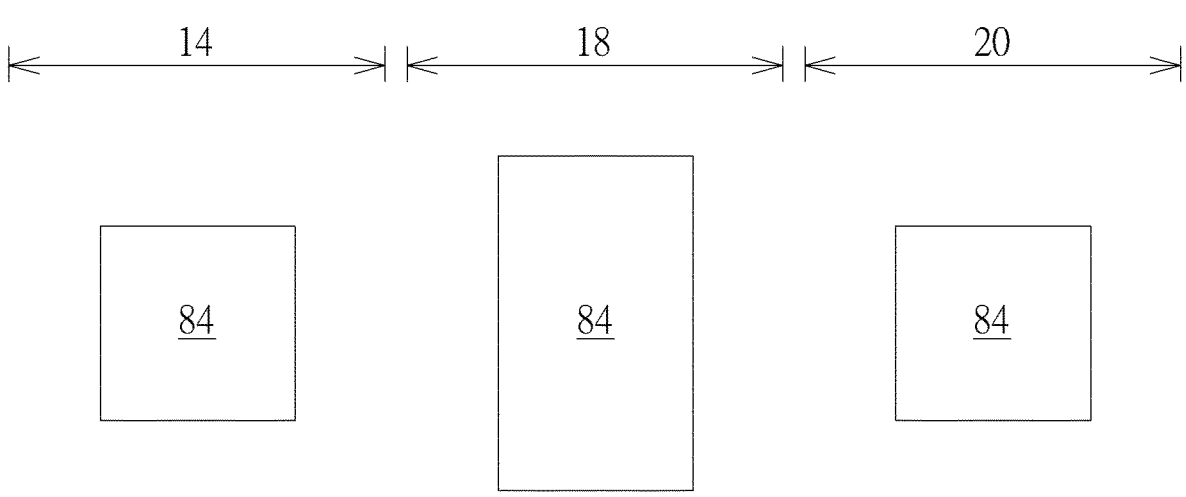
FIG. 2 illustrates a top view of the top level metal interconnections on the MRAM region, the PUF cell region, and the non-PUF cell region.
Figure 3:
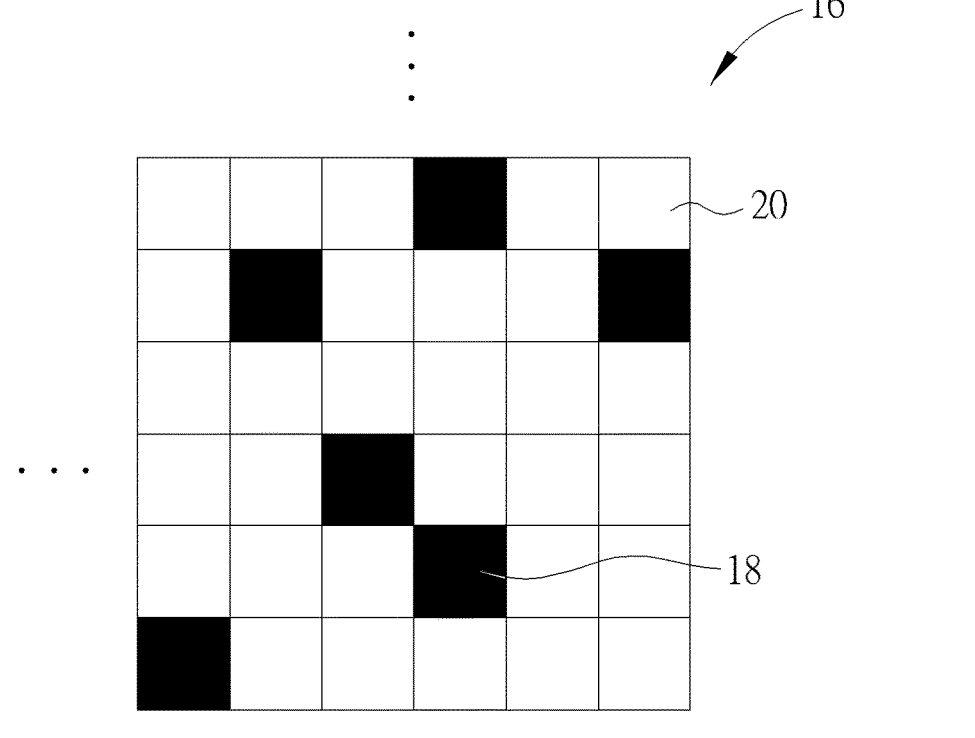
FIG. 3 illustrates a perspective view of a logic region having PUF cell regions and non-PUF cell regions arranged in an array.

Referring to FIGS. 1-3, FIGS. 1-2 illustrate a method for integrating a MRAM device and a PUF device according to an embodiment of the present invention and FIG. 3 illustrates a perspective view illustrating an array arrangement of a logic region. As shown in FIGS. 1-3, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs). A MRAM region 14 and a logic region 16 are defined on the substrate 12, in which the logic region 16 further includes a plurality of PUF cell regions 18 and non-PUF cell regions 20 arranged in an array.

Active devices such as metal-oxide semiconductor (MOS) transistors, passive devices, conductive layers, and interlayer dielectric (ILD) layer 52 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates), source/drain regions, spacers, epitaxial layers, and contact etch stop layer (CESL). The ILD layer 52 could be formed on the substrate 12 to cover the MOS transistors, and a plurality of contact plugs (not shown) could be formed in the ILD layer 52 to electrically connect to the gate structure and/or source/drain region of MOS transistors. Since the fabrication of planar or non-planar transistors and ILD layer is well known to those skilled in the art, the details of which are not explained herein for the sake of brevity.

The semiconductor device also includes metal interconnect structures 54, 56 disposed on the ILD layer 52, MTJ 24 disposed on the metal interconnect structure 56, metal interconnection 60 disposed on the metal interconnect structure 54 on the PUF cell region 18 and non-PUF cell region 20, spacers 62 disposed on sidewalls of the MTJ 24, and another metal interconnect structure 66 disposed on the MTJ 24 and the metal interconnection 60.

In this embodiment, the metal interconnect structure 54 includes a stop layer 68, an IMD layer 70, and a plurality of metal interconnections 72 embedded within the stop layer 68 and the IMD layer 70, the metal interconnect structure 56 includes a stop layer 74, an IMD layer 76, and a plurality of metal interconnections 78 embedded in the stop layer 74 and the IMD layer 76, and the metal interconnect structure 66 includes a stop layer 80, an IMD layer 82, and metal interconnections 84 embedded in the stop layer 80 and the IMD layer 82.

In this embodiment, each of the metal interconnections 72, 78, 84 within the metal interconnect structures 54, 56, 66 and the metal interconnection 60 could be fabricated according to a single damascene or dual damascene process in the IMD layers 70, 76, 82 and/or the stop layers 68, 74, 80 and connected to each other. For instance, each of the metal interconnections 72 preferably include a trench conductor, each of the metal interconnections 78 preferably include a via conductor, each of the metal interconnections 84 preferably include a via conductor directly contacting the MTJ 24 and metal interconnections 60 underneath and a trench conductor above the via conductor, the metal interconnection 60 preferably includes a trench conductor. In this embodiment, the metal interconnections 60 disposed on the logic region 16 and on the same level as the MTJ 24 typically includes a second level via conductor (V2) and a third level trench conductor (M3) and the metal interconnection 84 disposed above the MTJ 24 and the metal interconnection 60 includes a third level via conductor (V3) and a fourth level trench conductor (M4).

It should be noted that since the top surface of the MTJ 24 on the MRAM region 14 is lower than the top surface of the surrounding IMD layer 64 and in order to electrically or physically connect the metal interconnection 84 or the via conductor from the metal interconnection 84 to the MTJ 24 underneath, the metal interconnection 84 is typically inserted downward into the IMD layer 64 to directly contact the MTJ 24. In other word, the bottom surface of the metal interconnection 84 connected to the MTJ 24 on the MRAM region 14 is slightly lower than the bottom surface of the metal interconnections 84 on the PUF cell region 18 and non-PUF cell region 20. To serve as a unique feature in a PUF device, the bottom surface of the metal interconnection 84 on the PUF cell region 18 is slightly extended downward and inserted into part of the metal interconnection 60 underneath for creating a defect. The metal interconnection 84 on the non-PUF cell region 20 on the other hand since being a normal metal interconnect structure has a bottom surface even with the top surface of the metal interconnection 60 underneath and not inserted into part of the metal interconnection 60 as the metal interconnection 84 on the PUF cell region 18.

Moreover, each of the metal interconnections 72, 78, 84 could further include a barrier layer 86 and a metal layer 88, in which the barrier layer 86 could be selected from the group consisting of titanium (Ti), titanium nitride (TiN), tantalum (Ta), and tantalum nitride (TaN) and the metal layer 88 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layers 88 are preferably made of copper, the IMD layers 70, 76, 82 are preferably made of silicon oxide, and the stop layers 68, 74, 80 are preferably made of nitrogen doped carbide (NDC), silicon nitride, silicon carbon nitride (SiCN), or combination thereof.

In this embodiment, the formation of the MTJ 24 could be accomplished by sequentially forming a bottom electrode 90, a MTJ stack, a top electrode 98, and a patterned mask (not shown) on the metal interconnect structure 56, in which the MTJ stack preferably includes a pinned layer 92, a barrier layer 94, and a free layer 96 on the bottom electrode 90. In this embodiment, the bottom electrode 90 and the top electrode 98 are preferably made of conductive material including but not limited to for example Ta, Pt, Cu, Au, Al, or combination thereof. The pinned layer 92 could be made of ferromagnetic material including but not limited to for example iron, cobalt, nickel, or alloys thereof such as cobalt-iron-boron (CoFeB) or cobalt-iron (CoFc). Moreover, the pinned layer 92 could also be made of antiferromagnetic (AFM) material including but not limited to for example ferromanganese (FeMn), platinum manganese (PtMn), iridium manganese (IrMn), nickel oxide (NiO), or combination thereof, in which the pinned layer 92 is formed to fix or limit the direction of magnetic moment of adjacent layers. The barrier layer 94 could be made of insulating material including but not limited to for example oxides such as aluminum oxide ($AlO_x$) or magnesium oxide (MgO). The free layer 96 could be made of ferromagnetic material including but not limited to for example iron, cobalt, nickel, or alloys thereof such as cobalt-iron-boron (CoFeB), in which the magnetized direction of the free layer 96 could be altered freely depending on the influence of outside magnetic field.

Next, a pattern transfer process or a photo-etching process is conducted by using a patterned mask such as patterned resist remove part of the top electrode 98, part of the MTJ stack, and part of the bottom electrode 90 to form the MTJ 24, in which the MTJ 24 preferably directly contacting and electrically connecting the metal interconnections 78 underneath.

Referring again to FIG. 2, FIG. 2 illustrates a top view of the top level metal interconnection 84 on the MRAM region 14, the PUF cell region 18, and the non-PUF cell region 20.

As shown in FIG. 2, the metal interconnection 84 directly on top of the MTJ 24 on the MRAM region 14 and the metal interconnection 84 on the PUF cell region 18 under a top view perspective preferably have different shapes, the metal interconnection 84 on the PUF cell region 18 and the metal interconnection 84 on the non-PUF cell region 20 preferably have different shapes, and the metal interconnection 84 on the MTJ 24 of the MRAM region 14 and the metal interconnection 84 on the non-PUF cell region 20 have same shape.

For instance, the metal interconnection 84 directly on top of the MTJ 24 on the MRAM region 14 under the top view perspective includes a square, the metal interconnection 84 on the PUF cell region 18 under the top view perspective include a rectangle, and the metal interconnection 84 on the non-PUF cell region 20 under the top view perspective have a square. It should be noted that even through both the metal interconnection 84 on the MTJ 24 of the MRAM region 14 and the metal interconnection 84 on the non-PUF cell region 20 under top view perspective include square patterns, the square from the MRAM region 14 and the non-PUF cell region 20 could have either same size or different size depending on the demand of the process. In other words, the metal interconnections 84 on the MRAM region 14 and non-PUF cell region 20 under top view could have same lengths and widths or different lengths and widths, which are all within the scope of the present invention.

Typically, metal interconnections 84 on the MRAM region 14 under the top view perspective if were to have rectangular shape pattern would often induce poor copper (Cu) coverage on the bottom of the via hole and results in copper loss and random opening. It is therefore critical for the metal interconnection 84 directly on top of the MTJ 24 of the MRAM region 14 to have a square shape pattern under top view perspective. In contrast to the metal interconnections 84 on the MRAM region 14 required to have rectangular pattern under top view perspective, the metal interconnections 84 on the logic region 16 however could have either square or rectangular pattern depending on the demand of the product. For instance, it would be desirable to form rectangular metal interconnections 84 on the PUF cell region 18 while having square metal interconnections 84 on the non-PUF cell region 20. Preferably, the rectangular metal interconnection 84 on the PUF cell region 18 as shown in FIG. 1 is inserted downward into part of the metal interconnection 60 underneath to create a defect while the square metal interconnection 84 on the non-PUF cell region 20 only contacts the top surface of the metal interconnection 60 without being inserted into part of the metal interconnection 60. According to a preferred embodiment of the present invention, the metal interconnection 84 on the PUF cell region 18 having a rectangular pattern under top view could be used as a distinct feature for the PUF device.

Overall, the present invention provides a means of using metal interconnections having different shapes under top view for preparing a PUF device during integration of MRAM process and logic process. Preferably, it would be desirable to form metal interconnections 84 having same shape under top view perspective on the MRAM region 14 and non-PUF cell region 20 and metal interconnections 84 having different shape under top view perspective on the MRAM region 14 and PUF cell region 18 during fabrication of the top level metal interconnections 84 on the MRAM region, PUF cell region 18, and non-PUF cell region 20. For instance, the metal interconnections 84 on the MRAM region 14 and non-PUF cell region 20 under top view preferably have square pattern while the metal interconnection 84 on the PUF cell region 18 have rectangular pattern. As disclosed in the aforementioned embodiment, despite the fact that rectangular metal interconnections 84 may induce numerous defects, these defects could particularly be used as a unique or unclonable feature for a PUF device or chip.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a physically unclonable function (PUF) device, comprising:

providing a substrate comprising a magnetoresistive random access memory (MRAM) region and a PUF cell region;

forming a first metal interconnection on a magnetic tunneling junction (MTJ) in the MRAM region; and forming a second metal interconnection on the PUF cell region, wherein the first metal interconnection and the second metal interconnection comprise patterns of different shapes.

2. The method of claim 1, further comprising:

defining a logic region on the substrate, wherein the logic region comprises the PUF cell region and a non-PUF cell region; and forming a third metal interconnection on the non-PUF cell region.

3. The method of claim 2, wherein the first metal interconnection and the third metal interconnection comprise patterns of same shape.

4. The method of claim 2, wherein the second metal interconnection and the third metal interconnection comprise patterns of different shapes.

5. The method of claim 2, wherein the third metal interconnection comprises a square pattern.

6. The method of claim 1, wherein the second metal interconnection comprises a rectangular pattern.

7. The method of claim 1, wherein the first metal interconnection comprises a square pattern.

* * * * *